United States Patent [19]
Lucas et al.

[11] Patent Number: 5,144,742
[45] Date of Patent: Sep. 8, 1992

[54] METHOD OF MAKING RIGID-FLEX PRINTED CIRCUIT BOARDS

[75] Inventors: Gregory L. Lucas, Newark; Scott K. Bryan, San Jose, both of Calif.

[73] Assignee: Zycon Corporation, Santa Clara, Calif.

[21] Appl. No.: 661,983

[22] Filed: Feb. 27, 1991

[51] Int. Cl.⁵ .............................................. H05K 3/36
[52] U.S. Cl. ........................................ 29/830; 29/846; 156/291; 156/578; 174/254
[58] Field of Search .................... 29/846, 830, 852; 174/254; 156/291, 578

[56] References Cited

U.S. PATENT DOCUMENTS

| | | | |
|---|---|---|---|
| 3,409,732 | 11/1968 | Dahlgren et al. | 174/254 |
| 3,546,775 | 12/1970 | Lalmond et al. | 29/846 X |
| 4,075,420 | 2/1978 | Walton | 174/254 X |
| 4,496,794 | 11/1985 | Darms et al. | 174/254 |
| 4,562,119 | 12/1985 | Darms et al. | 174/254 X |
| 4,800,461 | 1/1989 | Dixon et al. | 29/846 X |
| 4,931,134 | 6/1990 | Hatkevitz et al. | 29/896 X |
| 5,004,639 | 4/1991 | Desai | 174/254 X |

FOREIGN PATENT DOCUMENTS

| 195935 | 10/1986 | European Pat. Off. | |
| 1-53591 | 3/1989 | Japan | 29/846 |

Primary Examiner—Carl J. Arbes
Attorney, Agent, or Firm—John A. Bucher

[57] ABSTRACT

Rigid-flex printed circuit boards (PCBs) are fabricated by an improved and simplified process to form the PCBs from rigid-flex PCB subassemblies with both rigid and flex sections incorporating suitable insulator materials. The flex sections of the PCB subassemblies are protectively covered by insulating layers formed by deposition of a liquid precursor for the insulator material and curing of the liquid precursor to form the insulating layers.

14 Claims, 4 Drawing Sheets

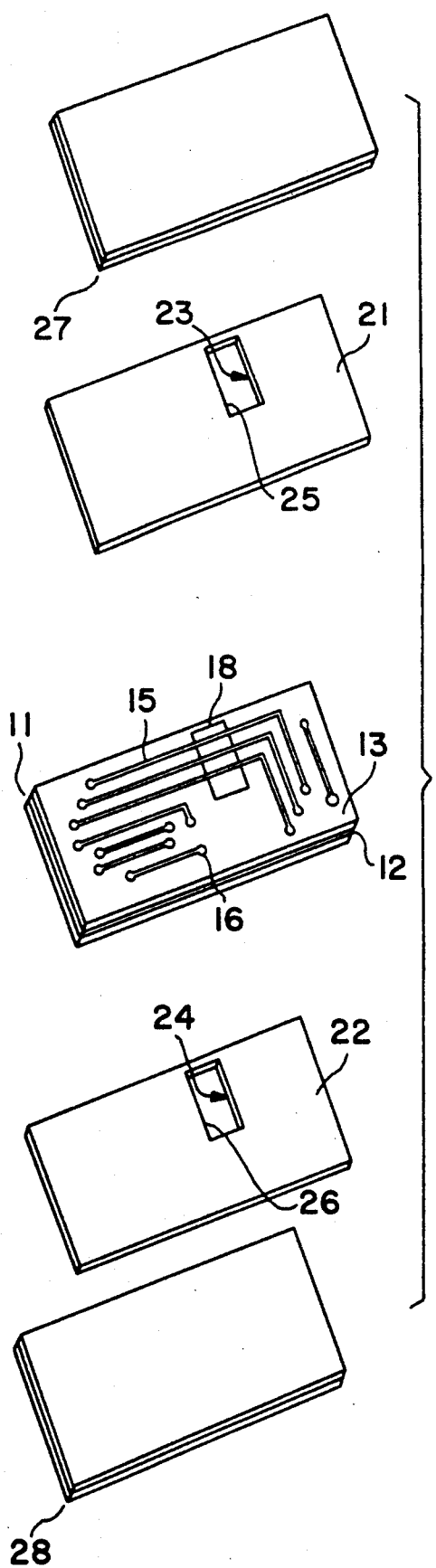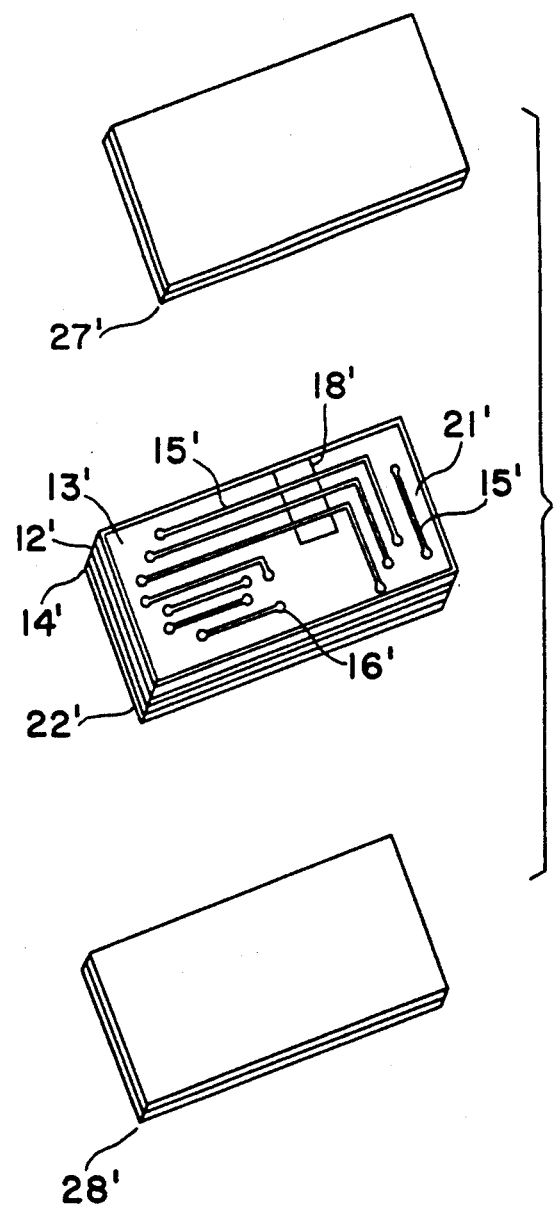
FIG. 3A
FIG. 3B

METHOD OF MAKING RIGID-FLEX PRINTED CIRCUIT BOARDS

FIELD OF THE INVENTION

The present invention relates to printed circuit boards and more particularly to rigid-flex PCBs and methods of manufacture.

BACKGROUND OF THE INVENTION

The present invention is an alternative to and/or improvement over multi-layer rigid-flex printed circuit boards disclosed, for example, in U.S. Pat. No. 4,800,461 issued Jan. 24, 1989 to Dixon, et al. under assignment to Teledyne Industries, Inc.

As noted in the above patent, techniques for making multi-layer rigid-flex PCBs are well known in the field as disclosed, for example, in U.S. Pat. No. 3,409,732, also assigned to Teledyne Industries, Inc. As disclosed in that earlier patent, rigid-flex stacked printed circuit boards include flexible printed circuit cables extending from the periphery of the rigid sections. The rigid portions of the flex cables are typically used as sites for electronic components or mechanical hardware. The copper conductors in each plane or layer are usually fabricated from one continuous sheet of copper foil.

With improvements in electronic technology, there has been a constant need for advances in electronic packaging. This need has led to more complex multi-layer rigid-flex printed circuit boards with many boards now using up to twenty-five, or even more, layers of circuitry. However, severe problems developed when the rigid circuit portions included many layers of conductors and holes plated through with copper to provide conductor barrels connecting the conductor layers.

As also discussed in the background of U.S. Pat. No. 3,409,732, certain problems encountered in such rigid-flex printed circuit boards are created by the thermal expansion of typical insulator materials, such as acrylic adhesives and Kapton (a trademark of E.I. duPont de Nemours and Company, Inc. for polyimide film) utilized in the construction of rigid-flex PCBs. Thus, failures tend to occur when the board is subjected to elevated temperatures in thermal stress testing, hot oil solder reflow, and the like. The rate of thermal expansion (a fundamental material property) of the acrylic adhesive is about 30 percent, of Kapton about 10 percent, and of copper about 4 percent. When hot oil is used to reflow solder plated on the rigid printed circuit board, temperatures on the order of 450°-500° degrees F. cause expansion, for example, of the acrylic adhesive used to bond Kapton layers to copper layers in the multilayer rigid sections. As temperatures increase, the board, which is unrestrained, grows much faster in the thickness, or Z direction, then "copper barrels" formed in the plated through holes in the multilayer rigid board section. The copper barrels stretch as the acrylic adhesive and Kapton expand, sometimes fracturing the copper. Repeated cycles tend to break many of the plated copper barrels found in the holes in the rigid board sections.

If less acrylic adhesive is used to limit expansion, the internal stresses developed during lamination procedures cause unacceptable voids or delaminations in the final board. Since these deficiencies are not apparent until the final stages of construction, costly scrapping of nearly completed boards may be required.

It is now apparent that multilayer rigid-flex boards including insulator materials such as acrylic adhesive and Kapton always place Z-axis stress on plated through-holes. The coefficient of thermal expansion of the acrylic adhesive (Z-axis expansion) is the dominant influence. Because of the amount of acrylic required in many multilayer rigid-flex applications, all plated through-holes are stressed, with many of these cracking, making the boards unusable.

Another difficulty disclosed with the use of dielectric films such as Kapton in the rigid board area is their absorption of excessive moisture, on the order of up to 3 percent by weight of water. Absorbed moisture in the circuitry, which does not escape, may volatilize during high temperature operations and cause unacceptable delamination in the rigid board area. To remove the moisture from the Kapton and acrylic layers, the board must be baked at temperatures on the order of 250 degrees F. for many hours, for example 12, 24 or even 48 hours, an expensive process.

Yet another difficulty with insulator materials such as Kapton and acrylic adhesives involves the cleaning of holes, which have been drilled through the laminated rigid board, prior to plating through the holes. The excellent chemical resistance of the acrylic adhesive to typical cleaning solutions precludes the use of cleaning solutions for removal of smears resulting from hole drilling. Also, acrylics are prone to swelling due either to exposure to cleaning fluids during smear removal or to improper smear removal processing. To avoid these problems, expensive plasma etching is required to clean the holes.

As a solution to the above problems, the above noted Dixon, et al. patent provided a multilayer rigid-flex printed circuit board fabricated by a process providing a rigid section incorporating insulator materials which, when subjected to elevated temperatures, resisted expansion in the Z direction which would otherwise cause difficulties, including delamination and cracking of plated through copper barrels.

The Dixon, et al. process taught the formation of the flex sections, for example, from a prepreg glass layer laminated with Kapton insulation layers carrying acrylic adhesive as being sufficiently flexible and tear resistant to provide satisfactory results in use. The Kapton layers of the flex sections extended to but not substantially into, the rigid sections of the boards.

The Dixon, et al. patent also disclosed another embodiment wherein the flex sections of the rigid-flex printed circuit boards were fabricated without a prepreg glass layer to accord even greater flexibility therein.

The method and product disclosed by the Dixon, et al. patent were found to be very effective for their intended purpose as summarized above.

However, the rigid-flex printed circuit board formed according to the Dixon, et al. patent was found to be relatively expensive and time consuming to manufacture because of the additional steps of forming the (Kapton/adhesive) insulator layers or sheets and then laminating those combinations onto the flexible sections of the PCB while laminating a single prepreg layer over the rigid sections to form printed circuit board subassembly.

SUMMARY OF THE INVENTION

There has accordingly been found to remain a need for an improved rigid-flex printed circuit board product and method of fabrication. It is thus an object of the present invention to provide an improved rigid-flex printed circuit board or PCB, preferably of a multilayer type, and accompanying methods of manufacture, overcoming problems of the type outlined above and simplifying and facilitating manufacture of the improved printed circuit board.

The rigid-flex PCB of the invention preferably includes a rigid section or sections incorporating insulator materials which, when subjected to elevated temperatures, do not expand sufficiently in the Z direction to cause difficulties, including delamination and cracking of plated through copper barrels. This is accomplished by eliminating from the rigid sections of the boards materials tending to cause such undesirable expansion in the Z direction of the multilayer rigid section of the board, and materials absorbing excessive amounts of moisture, such as acrylic adhesives and polyimide film, those materials normally being used in rigid-flex printed circuit boards.

More specifically, it is an object of the present invention to provide a method for forming the rigid-flex PCBs and subassemblies therein, having both rigid and flex sections, the flex sections including layers of a flexible insulating material deposited as a liquid, for example, by screen printing or photo imaging, the deposited liquid material then being cured in order to produce the flex sections in the rigid-flex PCBs with sufficient flexibility and tear resistance during use.

It is also a more specific object of the invention to provide rigid-flex PCBs and PCB subassemblies formed in the above manner.

Even more specifically, it is an object of the invention to provide both rigid-flex PCBs and PCB subassemblies as well as methods of making both wherein the deposited liquid material is a precursor for the flexible insulating material and selected from the class consisting of acrylics, epoxys, urethanes, copolymers including at least one of the above, mixtures and/or oligomers thereof. The acrylics may be in the form of acrylates with other materials such as styrenes and dienes being chemically close thereto. Accordingly, such materials are also contemplated in the class under the term acrylics. More preferably, the flexible insulating layers formed by liquid deposition and curing have a thickness in the range of about 0.0005 to about 0.003 inches.

Additional objects of the invention are made apparent in the following detailed description having reference to the accompanying drawings.

BRIEF DESCRIPTION OF THE DRAWINGS

FIG. 3A is an exploded view of multiple components to be laminated together in a final laminating step to form the rigid-flex PCB and including at least one rigid-flex PCB subassembly as illustrated in FIG. 1A.

FIG. 3B is a similar exploded view of multiple components to be laminated together in a final laminating step to form the rigid-flex PCB and including at least one rigid-flex PCB subassembly as illustrated in FIG. 1B.

DESCRIPTION OF THE PREFERRED EMBODIMENTS

Exemplary embodiments of the invention are illustrated in FIGS. 1A, 1B, 2A, 2B, 3A, 3B and 4. To summarize the invention generally, it involves forming a rigid-flex printed circuit board (PCB) from one or more subassemblies of the type illustrated for example in FIG. 1A. According to the present invention, a flexible insulating layer is applied to flex areas of the subassembly of FIG. 1A as a liquid precursor, the liquid preferably being deposited by conventional screen printing or photo-imaging techniques. The deposited liquid is then cured to form the flexible insulating layer as a protective covering over conductive circuitry and the like in flex portions of the subassembly. Another embodiment of a subassembly is described below with reference to FIG. 1B wherein rigid prepreg layers with suitable cutouts are laminated to opposite sides of the subassembly prior to deposition and curing of the liquid precursor.

Figure 1A:
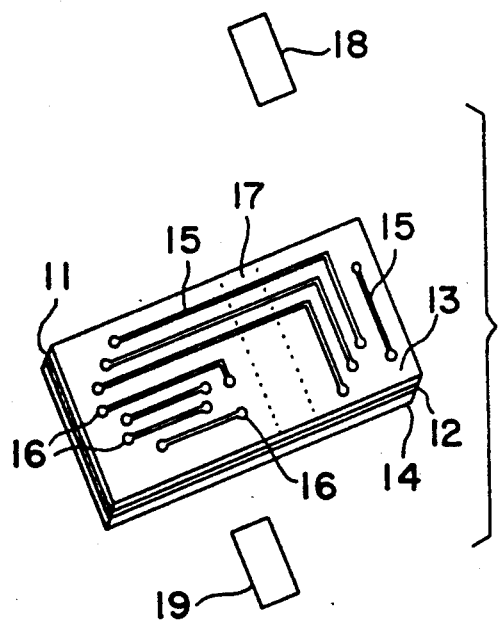
FIG. 1A is an exploded view of a rigid-flex PCB subassembly illustrating flexible insulating layers deposited over flex sections of the PCB subassembly according to the present invention.
Figure 4:
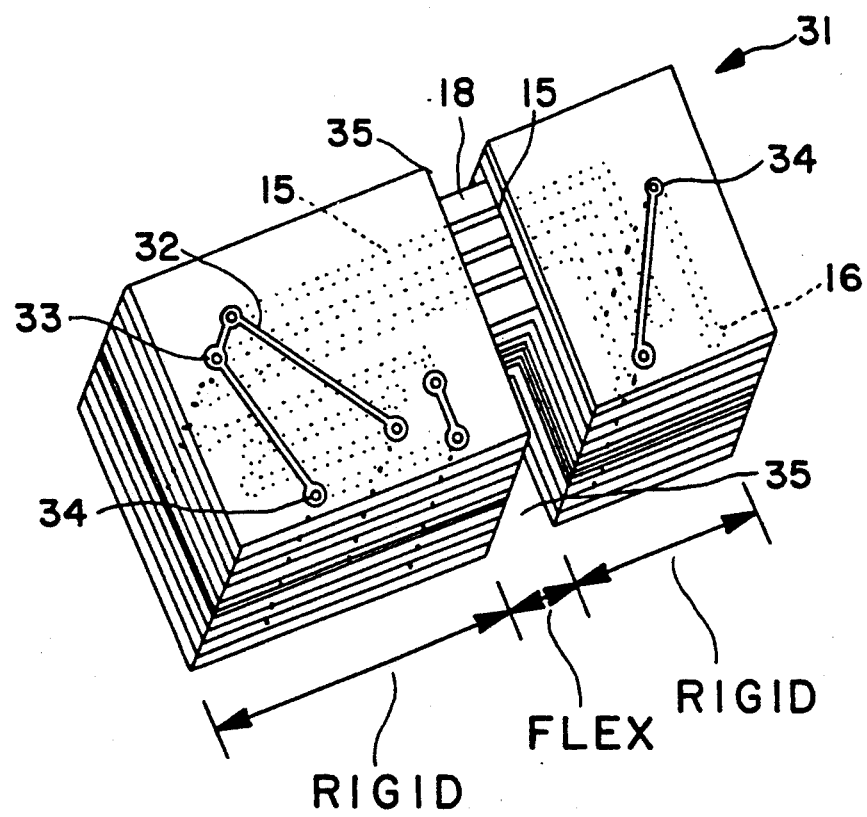
FIG. 4 is a perspective view of a rigid-flex PCB constructed according to the present invention following final lamination and other processing steps.

In any event, one or more subassemblies as illustrated in FIG. 1A and/or 1B are then laminated together with other components, as illustrated in FIGS. 3A and 3B to form a finished rigid-flex PCB illustrated in FIG. 4.

Figure 2A:
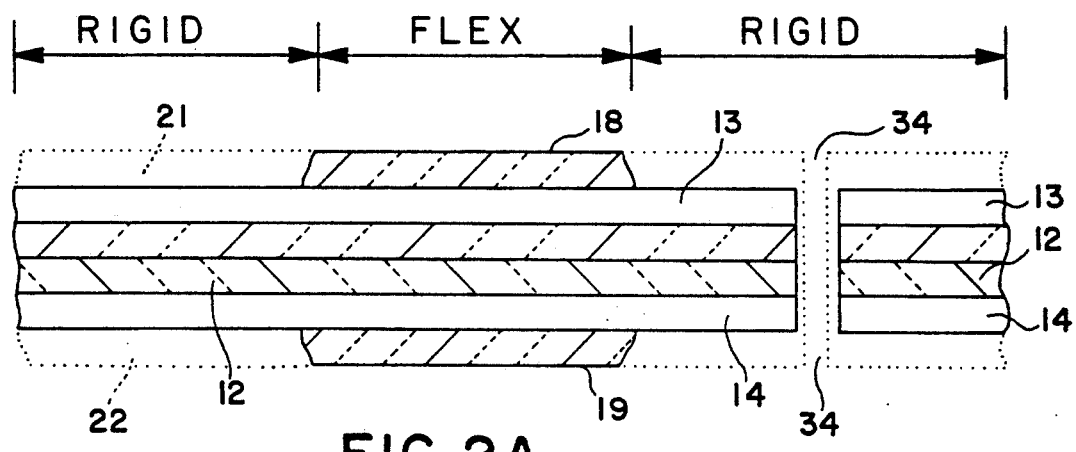
FIG. 2A is a cross-section taken longitudinally through the PCB subassembly of FIG. 1A.
Figure 2B:
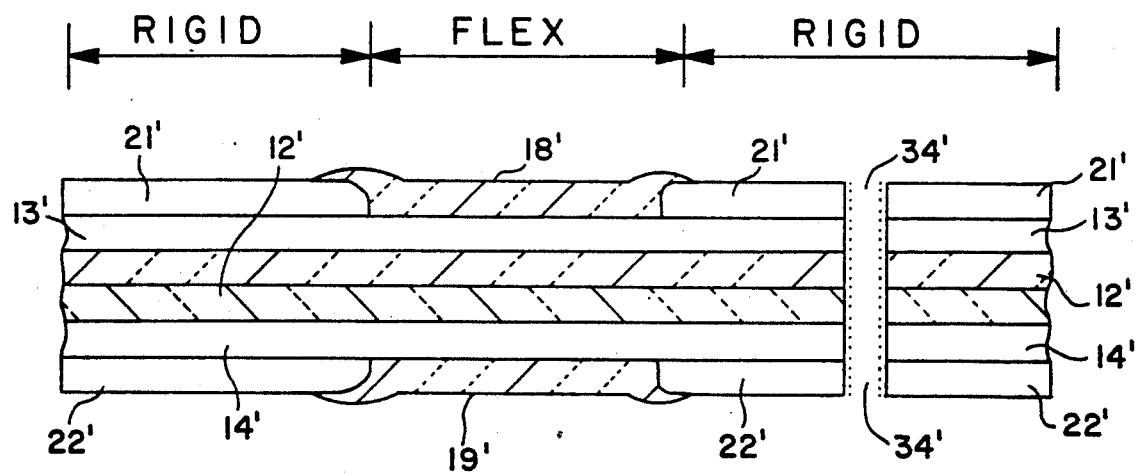
FIG. 2B is a similar cross-sectional view taken longitudinally through the rigid-flex PCB subassembly of FIG. 1B.

The specific configuration of the flexible insulating layer deposited as a liquid and then cured is illustrated in cross-section in FIGS. 2A and 2B.

For the embodiments illustrated in FIGS. 1-4, the invention simplifies the process and makes it less expensive particularly by avoiding formation and manual laying up of the flexible insulating layers as existing films. In addition, the resulting rigid-flex PCB formed by the invention has improved characteristics over the prior art in that registration of laminar components is enhanced during final lamination as illustrated in FIGS. 3A and 3B because only one lamination step is required.

The method and product of the invention are described in greater detail below.

Initially, referring to FIG. 1A, a rigid-flex printed circuit board subassembly 11 is formed with a central insulating layer 12 and conductive layers 13 and 14 laminated on opposite sides thereof. A prelaminated subassembly with these components is commercially available from a number of sources as is well known to those skilled in the art.

Conductive circuitry 15 and pads 16 are formed on opposite surfaces of each subassembly 11 by conventional photographic and etching techniques also well known to those skilled in the art.

Within the subassembly 11, a selected surface portion indicated generally at 17 is contemplated to form a flex portion of the subassembly particularly in a resulting rigid-flex PCB (illustrated for example in FIG. 4).

The present invention contemplates novel formation of a flexible insulating layer over at least a portion of the flex surface portion 17 and remaining within the finished rigid-flex PCB (see FIG. 4). Such flexible insulating layers adapted for arrangement on opposite sides of the subassembly 11 are respectively indicated at 18 and 19.

In FIG. 1A, the flexible insulating layers 18 and 19 are illustrated as integral components apart from the subassembly 11 only for the purpose of illustrating the invention in the exploded view of FIG. 1A. However, according to the present invention, the flexible insulating layers 18 and 19 are formed in a particularly simple and inexpensive manner by deposition of a liquid precursor of the flexible insulating layer, the liquid precursor then being cured so that the flexible insulating layers 18 and 19 are formed in situ upon the subassembly 11.

More specifically, the liquid precursor is selected from a class consisting of acrylics, epoxys, urethanes, copolymers containing at least one of the above, mixtures and/or oligomers thereof. Preferably, the liquid precursor is an acrylic available for example under the trade names ENPLATE USR-11 from Enthone, Incorporated, West Haven, Conn. and RONASCREEN 1655 from LeaRonal, Freeport, N.Y.

The preferred acrylic liquid precursors are then cured by exposure to ultraviolet (UV) in a conventional UV curing machine at about 3 Joules/cm$^2$. The acrylic precursor may be cured by UV as noted above or catalytically or thermally. Preferably where the liquid precursor is in the form of a soldermask, conventionally used PCBs and comprising an acrylic base, photoinitiators, pigment and filler, for example, UV curing is employed to harden the acrylic liquid by polymerization and/or cross-linking, thus thermosetting the acrylic precursor to form the flexible insulating layer. Accordingly, where the term "curing" is employed herein, it is to be understood as being of a type suitable for use with the particular liquid precursor employed for forming the flexible insulating layer.

Figure 1B:
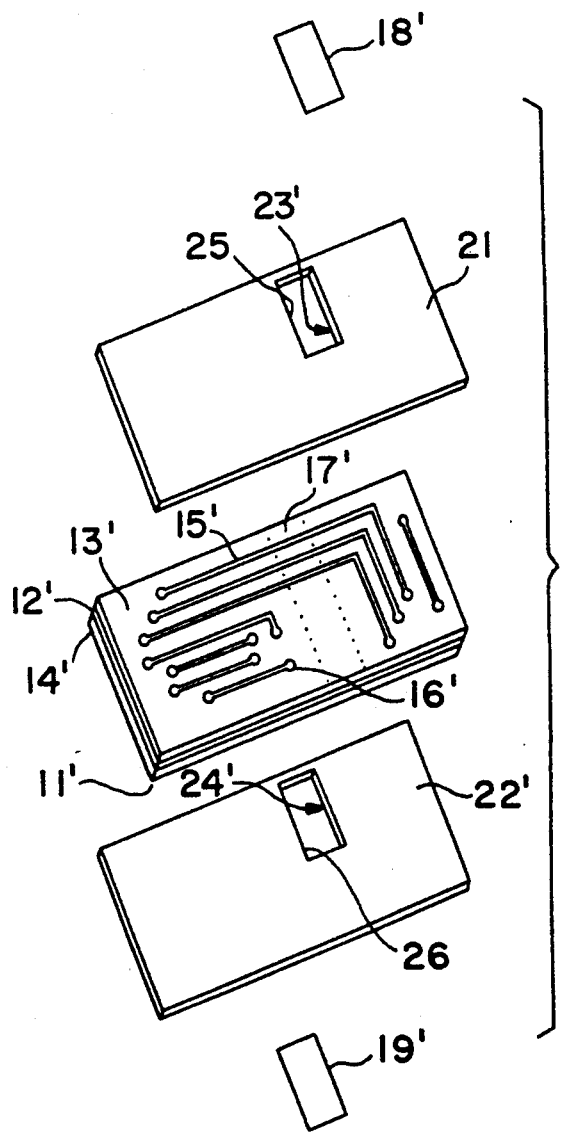
FIG. 1B is an exploded view similar to FIG. 1A but including rigid insulating layers arranged on opposite sides of the PCB subassembly.

In the exemplary embodiments of the invention illustrated in FIGS. 1-4, the first step is formation of the rigid-flex subassembly (11 or 11' in FIGS. 1A or 1B). As noted above, portions of the subassemblies 11 and 11' are made rigid by lamination with additional layers of prepreg material or the like, flex portions of the subassemblies resulting generally where additional material is not laminated to the subassembly.

As noted above, the subassemblies 11 and 11' may be preliminarily laminated together as described or obtained as a commerically available unit.

In the subassemblies 11 and 11', the central insulating layer 12 may be formed for example from one or two fiberglass sheets with the conductive layers 13 and 14 being formed from a suitable material such as copper (about ¼-2 ounces per square foot). The conductive layers 13 and 14 are typically laminated to the central insulating layer 12 in a manner well known to those skilled in the art.

The liquid precursors are preferably applied to the flex portions 17 of the subassembly 11 by conventional screen printing techniques as referred to above. Preferably, this technique involves placement of a fine woven mesh, for example, about 100-200 threads per inch monofilament polyester mesh imaged with a stencil. The mesh is spaced apart from the surface of the subassembly by about 0.010 to 0.30 inches. A squeegee or flexible doctor blade is then employed to apply the liquid precursor to the surface of the subassembly 11 through the mesh. During application, the mesh is forced down against the surface of the subassembly 11 so that it regulates the amount of liquid deposited thereupon. Thereafter, the mesh springs away from the surface leaving only the liquid which flows or self levels to form a preferred thickness as noted below.

The liquid precursor is then cured as described above to form the flexible insulating layers 18 and 19 as integral protective layers on opposite sides of the subassembly 11.

It is of course to be noted that other liquid precursors could be applied either by the above technique or other techniques such as conventional photo-imaging. Photo-imaging is a process which may be employed in place of the screen printing process described above for forming the flexible insulating layers in generally the same configuration. However, in the photo-imaging process, only a selected portion of the liquid precursor deposited upon the subassembly is exposed to UV. The unexposed portion of the liquid precursor layer is then removed, for example by means of a carbonate developing solution as is well known to those skilled in the art. The material remaining after treatment by the developing solution is then cured using thermal heat to form the same flexible insulating layers indicated for example at 18 and 19 in FIG. 1A. Photo-imaging techniques are preferred particularly where registry of the edges of the flexible conductive layers are critical upon the surfaces of the subassembly 11.

In the preceding description, neither the mesh nor squeegee is illustrated in the drawings since they are conventional components well known to those skilled in the art of screen printing.

In any event, the methods described above permit the formation of the subassembly 11 as an intermediate product for use in the formation of rigid-flex PCBs as illustrated in FIG. 4.

When the flexible insulating layers, for example that indicated at 18 in FIG. 1A, are deposited upon the subassembly 11, they have cross-sectional configurations as illustrated in FIG. 2A. In accordance with the preceding description, the subassembly 11 is preferably formed without rigid prepreg insulating layers arranged on opposite sides of the subassembly 11 during the liquid deposition and curing steps to form the flexible insulating layers 18 and 19. However, such prepreg layers are illustrated in phantom at 21 and 22 in FIG. 2A. Those layers are illustrated only to demonstrate that the flexible insulating layers 18 and 19 may be formed with generally a butt-joint along the surface of a cutout described in greater detail below for each of the rigid prepreg layers 21 and 22.

As an alternative to the design illustrated in FIGS. 1A and 2A, the flexible insulating layers 18 and 19 may also be deposited and cured upon the subassembly 11 to slightly underlap the rigid prepreg layers 21 and 22 (when the prepreg layers 21 and 22 are later positioned on opposite sides of the subassembly 11). Such an underlapping configuration may be preferred in order to provide some tolerance in assuring coverage of the entire surfaces of the subassembly 11 by either the flexible insulating layers 18 and 19 or the rigid prepreg layers 21 and 22.

Another embodiment of a subassembly according to the present invention is illustrated in FIG. 1B. Since the subassembly of FIG. 1B corresponds in large part to the subassembly of FIG. 1A, both the subassembly of FIG. 1B and its components are indicated by primed numerals similar to the numerical labels in FIG. 1A.

In the subassembly 11' of FIG. 1B, the same combination of the central insulating layer 12' and laminated conductive layers 13' and 14' has conductive circuitry 15' and conductive pads 16' formed thereupon as described above.

However, in the embodiment 11' of FIG. 1B, the rigid prepreg layers 21' and 22' are first laminated in place to opposite sides of the subassembly 11'. The rigid prepreg layers 21 and 22 are formed with cutouts 23 and 24 respectively registering with a portion of the flex surface 17' on the subassembly 11'.

The flexible insulating layers 18' and 19' are then formed over the portions of the flex surface 17' exposed by the cutouts 23 and 24. Here again, the flexible insulating layers 18' and 19' are formed by similar deposition of a liquid precursor and curing thereof. However, in the embodiment of FIG. 1B, the flexible insulating layers 18' and 19' preferably slightly overlap the edges 25 and 26 of the cutouts 23 and 24 to result in an overlapping configuration for that embodiment as illustrated in greater detail by the cross-sectional view of FIG. 2B.

With either of the embodiments represented by FIGS. 1A, 2A or 1B, 2B, the resulting subassembly 11 or 11' is then employed in a final lamination step with the application of heat and pressure in a manner well known to those skilled in the art. Generally, the final lamination step is illustrated in FIGS. 3A and 3B.

In FIG. 3A, the rigid prepreg layers 21 and 22 are illustrated in exploded relation relative to the subassembly 11 since they are not laminated thereto prior to the final lamination step. However, the rigid prepreg layers 21 and 22 are formed with the cutouts 23 and 24 for registry with the flexible insulating layers 18 and 19 as described above.

The final lamination assembly of FIG. 3A also includes additional laminates 27 and 28 which are laminated together with the subassembly 11 and the rigid prepreg layers 21 and 22 during the final lamination step.

By contrast, the final lamination step for the subassembly 11' of FIGS. 1B and 2B includes only the subassembly 11' with the rigid prepreg layers 21' and 22' already laminated thereto. Similar additional laminates 27' and 28' are bonded to the subassembly 11' and rigid prepreg layers 21' and 22' as illustrated.

Turning now to FIG. 4, either of the final laminate products from FIGS. 3A or 3B may be employed in the finished rigid-flex printed circuit board assembly 31 of FIG. 4. The finished PCB 31 of FIG. 4 includes at least one subassembly such as that indicated at 11 or 11' in the other figures. However, the PCB 31 may be formed with a plurality of such subassemblies, for example, to provide additional circuitry within the internal laminates thereof. Such techniques are of course also well known to those skilled in the art.

In any event, following assembly of the finished PCB 31 of FIG. 4 by the final laminating steps discussed above with respect to FIGS. 3A and 3B, other finishing steps may be performed on the PCB as necessary. For example, external conductive circuitry 32 and pads 33 may be formed on external surfaces of the additional laminates 27 and 28 by conventional outerlayer imaging techniques. In addition, through holes 34 may be drilled through the PCB 31 for appropriate register with various circuit components. In addition, the PCB may be subjected to desmearing, plating and other conventional techniques such as application of soldermask, hot air solder leveling and other fabrication techniques well known to those skilled in the art.

In addition, portions of the subassembly or subassemblies 11 may be removed, for example, by routing in order to assure proper formation of the flex portions 17 in the finished PCB 31. For example, referring also to FIGS. 3A and 3B for example, portions 35 of the flexible surface 17, not in register with the cutouts 23 and 24, are removed by routing so that only those portions of the flex surface 17 covered by the flexible insulating layers 18 and 19 remain in the flex section of the finished PCB 31. In that regard, note that a single flex section is labeled on the finished PCB 31 between rigid sections at opposite ends thereof. It is of course to be understood that other and possibly much more complex configurations of rigid and flex surface portions can be designed into both the subassemblies as illustrated for example at 11 and 11' as well as in the finished PCB 31.

In any event, there have been described above preferred embodiments of both rigid-flex printed circuit board components and subassemblies therein as well as methods of manufacture for both the rigid-flex PCB and the rigid-flex PCB subassemblies.

Variations and modifications in addition to those specifically set forth above will be apparent to those skilled in the art. Accordingly, the scope of the present invention is defined only by the following appended claims which are further exemplary of the invention.

What is claimed is:

1. A method of making a rigid-flex printed circuit board (PCB) having both flexible and rigid sections, comprising the steps of
    forming circuitry components on a rigid-flex PCB subassembly including laminated conductive layers on opposite sides of a central insulating layer,
    depositing a liquid precursor of flexible insulating layers over the circuitry components in portions of the PCB subassembly corresponding to flexible sections in the rigid-flex PCB,
    curing the liquid precursor to form the insulating layers as protective coatings over the circuitry components in the flexible sections, and
    finally laminating a plurality of components including at least one rigid-flex PCB subassembly and rigidizing insulating layers to form the rigid-flex PCB.

2. The method of claim 1 further comprising the step of forming rigid insulating layers generally coextensive with the rigid-flex PCB subassembly with cutouts corresponding to the flexible sections and arranging the rigid insulating layers on opposite sides of each rigid-flex PCB subassembly in the final lamination step.

3. The method of claim 2 wherein edge surfaces of each flexible insulating layer and cutout edge surfaces of the corresponding rigid insulating layer are in abutting relation with each other to form butt-joint therebetween.

4. The method of claim 2 wherein edge surfaces of each flexible insulating layer extend slightly past corresponding edge surfaces in the rigid insulating layer cutout to form the flexible insulating layer in underlapping relation to the cutout edge surfaces of the rigid insulating layer.

5. The method of claim 1 further comprising the steps of forming rigid insulating layers generally coextensive with the rigid-flex PCB subassembly with cutouts corresponding to the flexible sections, laminating the rigid insulating layers to opposite sides of each rigid-flex PCB subassembly, and then depositing and curing the liquid precursor to form the flexible insulating layers.

6. The method of claim 5 wherein edge surfaces of each flexible insulating layer extend slightly past corresponding edge surfaces in the rigid insulating layer cutout to form the flexible insulating layer in overlapping relation to the cutout edge surfaces of the rigid insulating layer.

7. The method of claim 1 wherein multiple rigid-flex PCB subassemblies are finally laminated to form the rigid-flex PCB.

8. The method of claim 1 wherein the liquid insulating layer precursor is selected from the class consisting of acrylics, epoxys, urethanes, copolymers including at least one of the above, mixtures and/or oligomers thereof.

9. The method of claim 8 wherein the flexible insulating layers are formed by liquid deposition and curing to have a thickness in the range of about 0.0005 to about 0.003 inches.

10. The method of claim 1 wherein the flexible insulating layers are formed by liquid deposition and curing to have a thickness in the range of about 0.0005 to about 0.003 inches.

11. A method for making a rigid-flex printed circuit board (PCB) subassembly as a component for lamination into a rigid-flex PCB having both flexible and rigid sections, comprising the steps of forming circuitry components on a rigid-flex PCB subassembly including laminated conductive layers on opposite sides of a central insulating layer, depositing a liquid precursor of flexible insulating layers over the circuitry components in portions of the PCB subassembly corresponding to flexible sections in the rigid-flex PCB, and curing the liquid precursor to form the insulating layers as protective coatings over the circuitry components in the flexible sections of the rigid-flex PCB subassembly.

12. The method of claim 11 further comprising the steps of forming rigid insulating layers generally coextensive with the rigid-flex PCB subassembly with cutouts corresponding to the flexible sections, laminating the rigid insulating layers to opposite sides of each rigid-flex PCB subassembly, and then depositing and curing the liquid precursor to form the flexible insulating layers.

13. The method of claim 11 wherein the liquid insulating layer precursor is selected from the class consisting of acrylics, epoxys, urethanes, copolymers including at least one of the above, mixtures and/or oligomers thereof.

14. The method of claim 13 wherein the flexible insulating layers are formed by liquid deposition and curing to have a thickness in the range of about 0.0005 to about 0.003 inches.

* * * * *